(12) United States Patent
Oshima

(10) Patent No.: US 6,894,395 B2
(45) Date of Patent: May 17, 2005

(54) SYSTEM ON A CHIP DEVICE INCLUDING A RE-WIRING LAYER FORMED BETWEEN GROUPS OF ELECTRONIC DEVICES

(75) Inventor: Nobuo Oshima, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/364,139

(22) Filed: Feb. 11, 2003

(65) Prior Publication Data

US 2003/0215993 A1 Nov. 20, 2003

(30) Foreign Application Priority Data

Feb. 13, 2002 (JP) ........................................ 2002-035306

(51) Int. Cl.[7] .............................................. H01L 29/00
(52) U.S. Cl. ...................... 257/777; 257/678; 438/460
(58) Field of Search ................................ 257/777, 678; 438/460, 106, 121

(56) References Cited

U.S. PATENT DOCUMENTS 6,707,244 B2 * 3/2004 Kimiya et al. .............. 313/414
6,724,084 B1 * 4/2004 Hikita et al. ................ 257/737
2002/0056899 A1 * 5/2002 Hikita et al. ................ 257/686

* cited by examiner

Primary Examiner—Dung A. Le
(74) Attorney, Agent, or Firm—Robert J. Depke; Holland & Knight LLP

(57) ABSTRACT

An LSI unit provided by the present invention comprises a molded LSI chip having bonding pads, and another LSI chip having another set of bonding pads which is placed on the molded LSI chip and electrically connected the molded LSI chip through bumps. In this LSI unit, the LSI chip is molded in a molding material, a re-wiring layer is formed, and bonding pads of the molded LSI chip are formed so as to correspond to the position of another set of bonding pads of another LSI chip, where the bonding pads of the molded LSI chip are formed over the molding material. Thus another LSI chip even larger in size than the molded LSI chip can be placed on the molded LSI chip and can be electrically connected thereto.

5 Claims, 14 Drawing Sheets

PRIORART
FIG.1
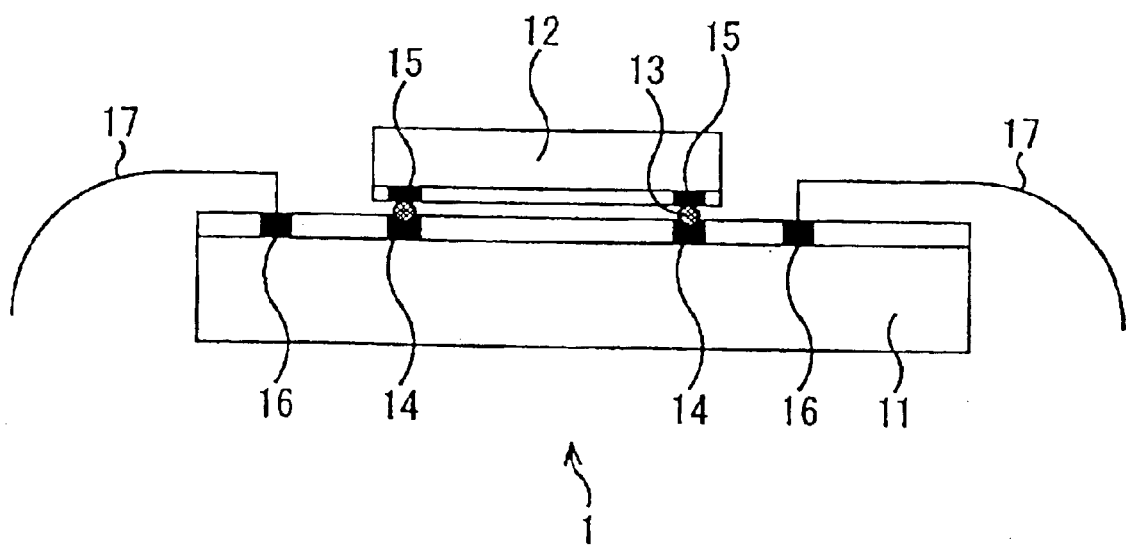

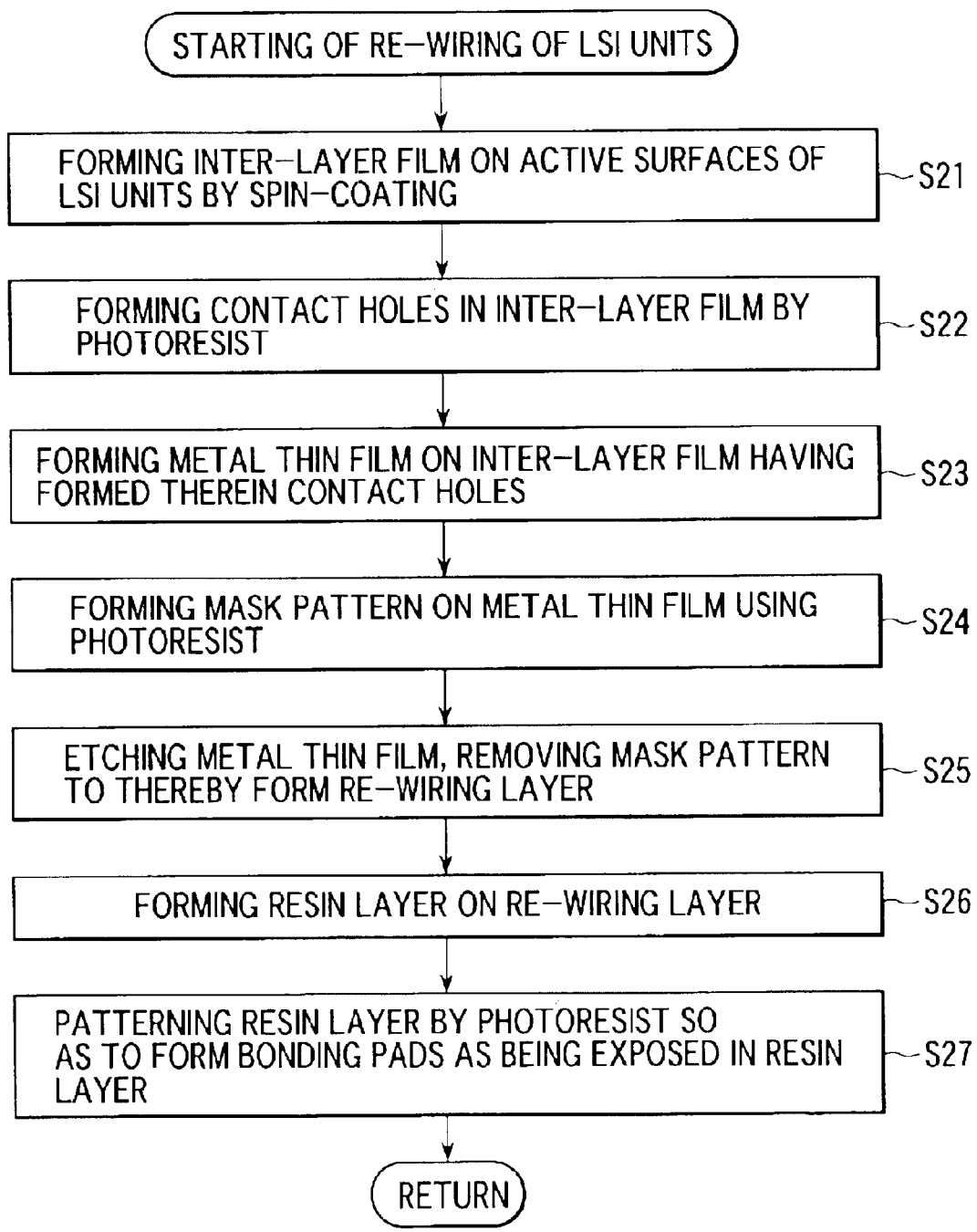

SYSTEM ON A CHIP DEVICE INCLUDING A RE-WIRING LAYER FORMED BETWEEN GROUPS OF ELECTRONIC DEVICES

CROSS REFERENCE TO RELATED APPLICATIONS

The present document is based on Japanese Priority Document JP2002-035306, filed in the Japanese Patent Office on Feb. 13, 2002, the entire contents of which being incorporated herein by reference.

TECHNICAL FIELD

The present invention relates to an electronic component and a method of fabricating thereof, and more specifically to an electronic component which is designed to allow expansion of the system scale at a low cost and a method of fabricating thereof.

BACKGROUND OF THE INVENTION

There are strong needs for downsizing, weight reduction and functional upgrading in the recent fields of mobile terminal and information/home appliances, which eventually demands functional upgrading of LSI (large-scale integrated circuit). Thus there is an accelerated trend of fabricating circuits using a plurality of different processes on a single wafer, which is known as SOC (system-on-chip).

SOC, however, requires a longer and more complicated process as compared with a single process, and thus has general tendencies of lower yield ratio and longer development period. SOC is also disadvantageous in that the individual circuits cannot be fabricated according to respective optimum processes since all processes are carried out on the wafer basis, which may yield poorer functions ones rather than those obtained in the single process.

In recent years, interest has been growing on SIP (system-in-package). The SIP is to make various (same kind of, or different kinds of) LSI or IC, which are fabricated by the conventional single process and are already inspected as non-defective, into a unit or module which can be handled as a single component (LSI or IC) by combining and re-wiring. SIP can thus readily realize an LSI unit or IC module having a high yield ratio and a diversified functions.

As a representative structure of the SIP, a chip-on-chip structure typified by an LSI unit 1 is shown in FIGS. 1 and 2. FIG. 1 shows a sectional side elevation of the LSI unit 1, and FIG. 2 shows a plan view of the LSI unit 1 as viewed from the top.

The LSI unit 1 comprises an LSI chip 11 having a lateral length of $x_1$ and a longitudinal length of $y_1$, and an LSI chip 12 having a lateral length of $x_2$ and a longitudinal length of $y_2$ (where $x_1 > x_2$ and $y_1 > y_2$).

In the LSI unit 1, the LSI chip 12 having bonding pads 15 is placed on the LSI chip 11 having bonding pads 14 so that the individual active surfaces thereof are faced with each other, and the both are electrically connected by placing bumps 13 in between. To bonding pads 16 of the LSI chip 11, wirings 17 used for connecting the LSI unit 1 to any external circuit (not shown) are bonded.

As shown in FIG. 1, the chip-on-chip structure has advantages in that enabling mounting of a plurality of LSI chips, reduction in mounting area through employment of a three-dimensional structure, and shortening of the wiring between the LSI chips through employment of the face-to-face configuration of the active surfaces.

SUMMARY OF THE INVENTION

In the above chip-on-chip structure, it is indispensable that layout of the bonding pads 14 of the lower LSI chip 11 and the bonding pads 15 of the upper LSI chip 12 coincide with each other both for physical and wiring integrities. The LSI chips 11 and 12 are, however, manufactured generally in an independent manner, so that it is almost unlikely that any of ready-made LSI chips can be combined so as to allow the bonding pads 14 and bonding pads 15 to oppose each other. As a consequence, there has been a problem that at least either of the LSI chips (e.g., LSI chip 12) must be manufactured according to a specific design therefor so as to allow combination with the LSI chip 11.

Another disadvantage resides in that the relations of lateral length of $x_1 > x_2$ and longitudinal length of $y_1 > y_2$ must always be satisfied so as to connect the LSI unit 1 with any external circuits as shown in FIG. 2, which inconveniently restricts size of the LSI chip to be connected, and consequently degrades the yield ratio of the LSI unit and cost-efficiency.

The present invention is conceived considering the foregoing situation, and is intended for achieving cost reduction and expansion of system scale.

An electronic component in accordance with an aspect of the present invention includes bonding pads formed by re-wiring of a molded electronic device; and another electronic device electrically connected through the bonding pads to the molded electronic device while allowing the active surface of the electronic devices to oppose with that of the molded electronic device.

The electronic devices may be semiconductor chips.

The bonding pads may be formed on the molding material.

A method of fabricating an electronic component in accordance with an aspect of the present invention includes: a first step for attaching an adhesive member which exhibits lower adhesiveness after the predetermined process, on a flat substrate; a second step for placing two or more electronic devices on the adhesive member while directing an active surfaces of the electronic devices facedown; a third step for molding the electronic devices using a molding material on the flat substrate; a fourth step for subjecting the adhesive member to the predetermined process to lower the adhesive force of the adhesive member, and for separating the molded electronic devices from the flat substrate; a fifth step for forming a re-wiring layer on the molded electronic devices using a metal thin film for forming bonding pads; a sixth step for placing other electronic devices on the molded electronic devices while allowing an active surfaces of both electronic devices to oppose each other, and for electrically connecting both electric devices through the bonding pads; and a seventh step for dicing the molded unit including the electronic devices at the molding material so as to separate the individual molded units.

The electronic devices may be semiconductor chips.

The bonding pads may be formed over the molding material.

In the electronic component and the fabricating method in accordance with an aspect of the present invention, the molded electronic device is provided with the re-wiring layer made of the metal thin film, and with the bonding pads, on which bonding pads another electronic device is placed so that the active surfaces of both devices are opposed each other, and both devices are then electrically connected.

BRIEF DESCRIPTION OF THE DRAWINGS

FIG. 1 is a sectional side elevation showing an exemplary configuration of a conventional LSI unit;

FIG. 6 is a flow chart for explaining details of re-wiring process of the LSI unit in step S7 in FIG. 4;

DESCRIPTION OF THE PREFFERRED EMBODIMENT(S)

Below, embodiments for carrying out the present invention will be described specifically and in detail with reference to the accompanying drawings.

Figure 2:
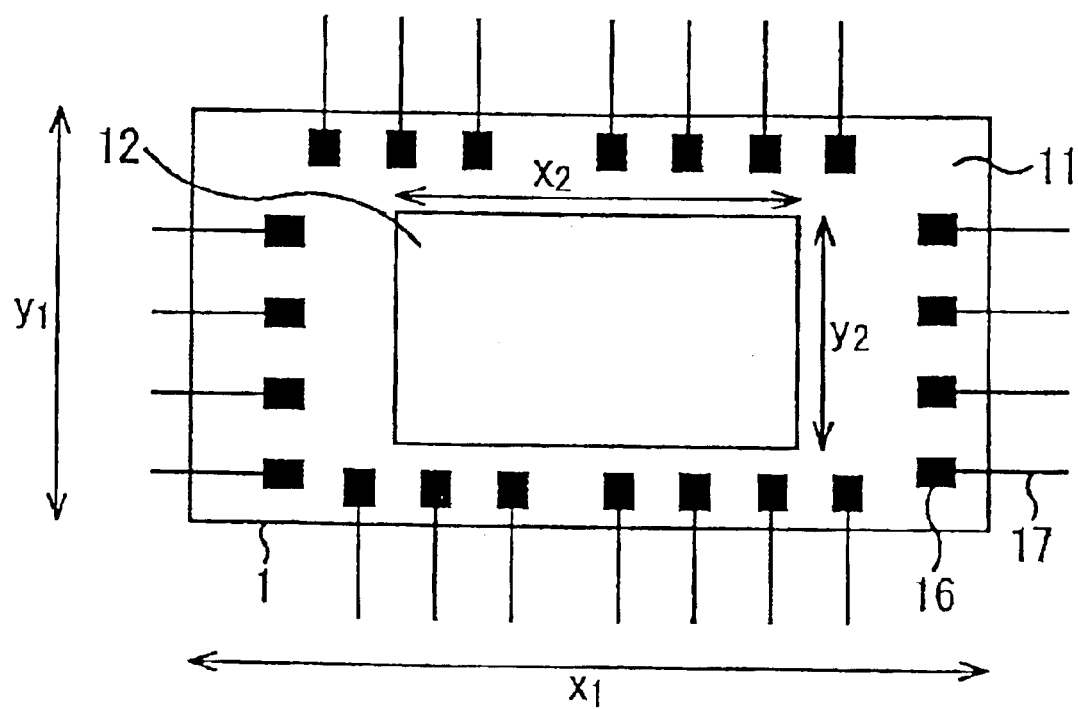
FIG. 2 is a plan view showing the configuration of the LSI unit shown in FIG. 1.
Figure 3:
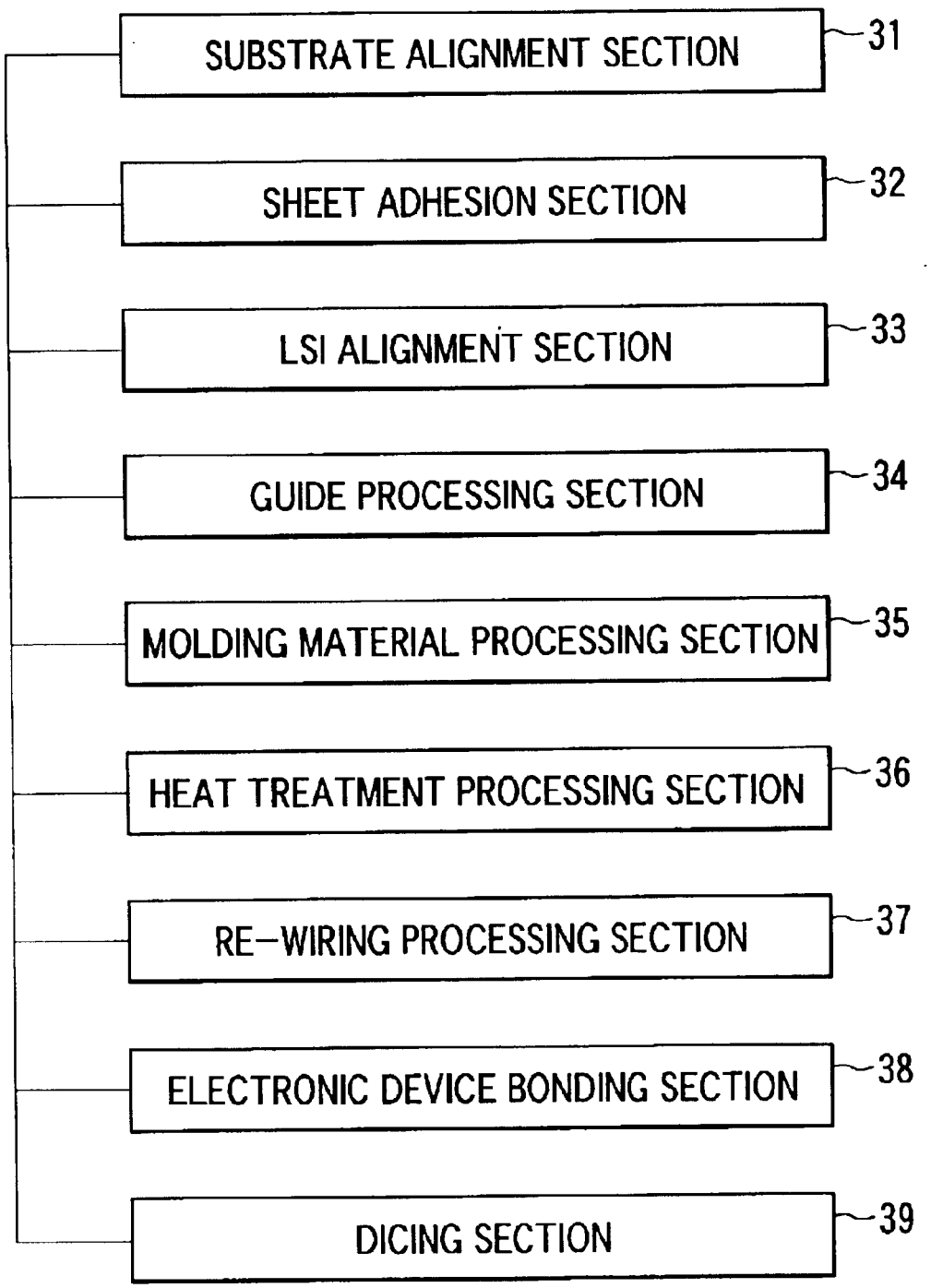
FIG. 3 is a block diagram showing a configuration of a fabrication process apparatus for LSI unit of an embodiment of the present invention.

FIG. 3 is a block diagram showing a configuration of a fabrication process apparatus for LSI unit of an embodiment of the present invention.

The fabrication process apparatus have a substrate alignment section 31, a sheet adhesion section 32, an LSI alignment section 33, a guide processing section 34, a molding material processing section 35, a heat treatment processing section 36, a re-wiring processing section 37, an electronic device bonding section 38 and a dicing section 39.

The substrate alignment section 31 provides a supporting substrate 51 (FIG. 5A) and placing it to a predetermined position. The sheet adhesion section 32 attaches an adhesive sheet 52 (FIG. 5B) on the supporting substrate 51, and coats a separation layer 53 (FIG. 5C) on the adhesive sheet 52.

The LSI alignment section 33 controls a mounter (not shown) having an image recognition function and placing LSI chips 54 (FIG. 5D) on the supporting substrate 51. The guide processing section 34 places and removes a flow-stop guide 57 (FIG. 5E) onto or from the periphery of the supporting substrate 51.

Figure 5A:
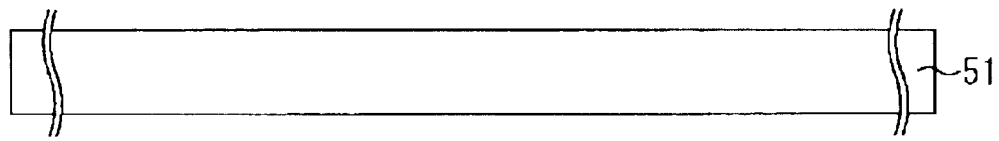
FIGS. 5A through 5N are schematic drawings for explaining fabrication processes of the LSI unit of the present invention.
Figure 5B:
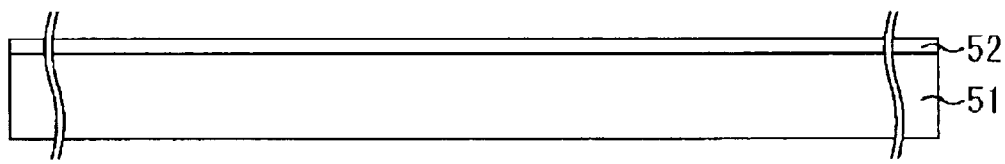
Figure 5C:
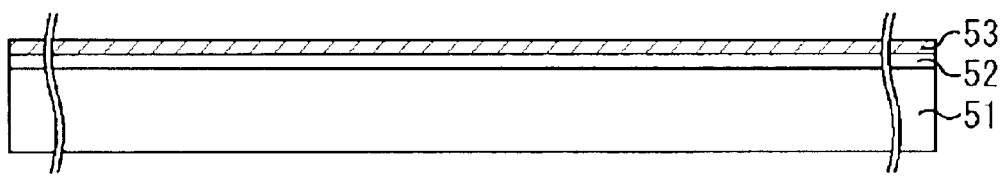

The molding material processing section 35 pours a molding material 58 (FIG. 5F) over the supporting substrate 51. The heat treatment section 36 heats everything formed on the supporting substrate 51 for curing the molding material 58, and separates the cured molding material 58 having LSI units 56 (FIG. 5G) from the supporting substrate 51.

The re-wiring processing section 37 re-wires the LSI units 56 whereby bonding pads 64 (FIG. 5M) for connecting other LSI chips (FIG. 5N) are formed. The electronic device bonding section 38 controls a mounter so as to place LSI chips 65 on the LSI units 56, to thereby electrically connect the LSI chips 65 and LSI units 56. The dicing section 39 dices the thus-formed semiconductor LSI integrated board including a plurality of LSI units 56 into the individual units.

Next, the fabrication process of the LSI unit of the embodiment in accordance with the present invention will be described referring to the flow chart in FIG. 4 and the process charts shown in FIG. 5A through FIG. 5N.

First in step S1, the substrate alignment section 31 provides the supporting substrate 51 (FIG. 5A) and aligns it to a predetermined position. The supporting substrate 51 is temporarily used for placing the LSI chips 54 (FIG. 5D), and is a square plate of approx. 20 cm in length and of 1 to 3 mm in thickness made of metal, glass or silicon. The surface of the supporting substrate 51 has specular finish.

Next in step S2, the sheet adhesion section 32 attaches the adhesive sheet 52 (FIG. 5B) on the supporting substrate 51, and then forms the separation layer 53 (FIG. 5C) by coating on the adhesive sheet 52. The separation layer 53, which has a property of reducing the adhesive force when irradiated by heat or ultraviolet radiation, is coated in order to lower adhesion strength of the adhesive sheet 52 in the later process step.

Next in step S3, the LSI alignment section 33 aligns a predetermined number of LSI chips 54 on the supporting substrate 51 while directing the active surfaces thereof facedown. Accordingly, the bonding pads 55 of the LSI chips 54 to come into contact with the separation layer 53. The LSI chips 54 are such as those fabricated in the single process and has already been inspected as non-defective.

Figure 5D:
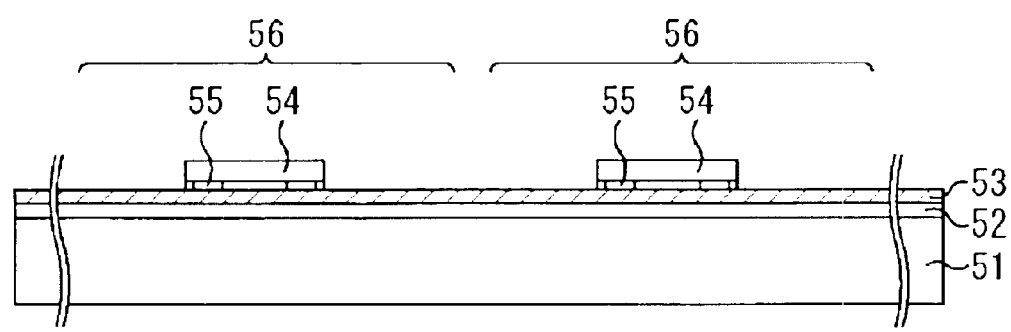

In an exemplary case shown in FIG. 5D, each LSI chip 54 composes one LSI unit (combination of LSI chips) 56. A predetermined number of LSI units 54 are placed at predetermined positions on the supporting substrate 51 so as to form a plurality of LSI units 56. More specifically, the provided LSI chips 54 are placed, using a mounter having an image recognition function, on the supporting substrate 51 at the positions previously defined in a precise manner with an accuracy of ±5 μm or higher while directing the active surfaces thereof facedown (in the direction of contact with the separation layer 53).

While one LSI unit 56 comprises only one LSI chip 54 in the exemplary case shown in FIG. 5D, it is also allowable to combine a plurality of LSI chips. The LSI chips to be combined may be of the same type or different types and may be combined in an arbitrary number but should be inspected to be non-defective. It is still also allowable to align components such as capacitor or resistor in place of the LSI chips.

Figure 4:
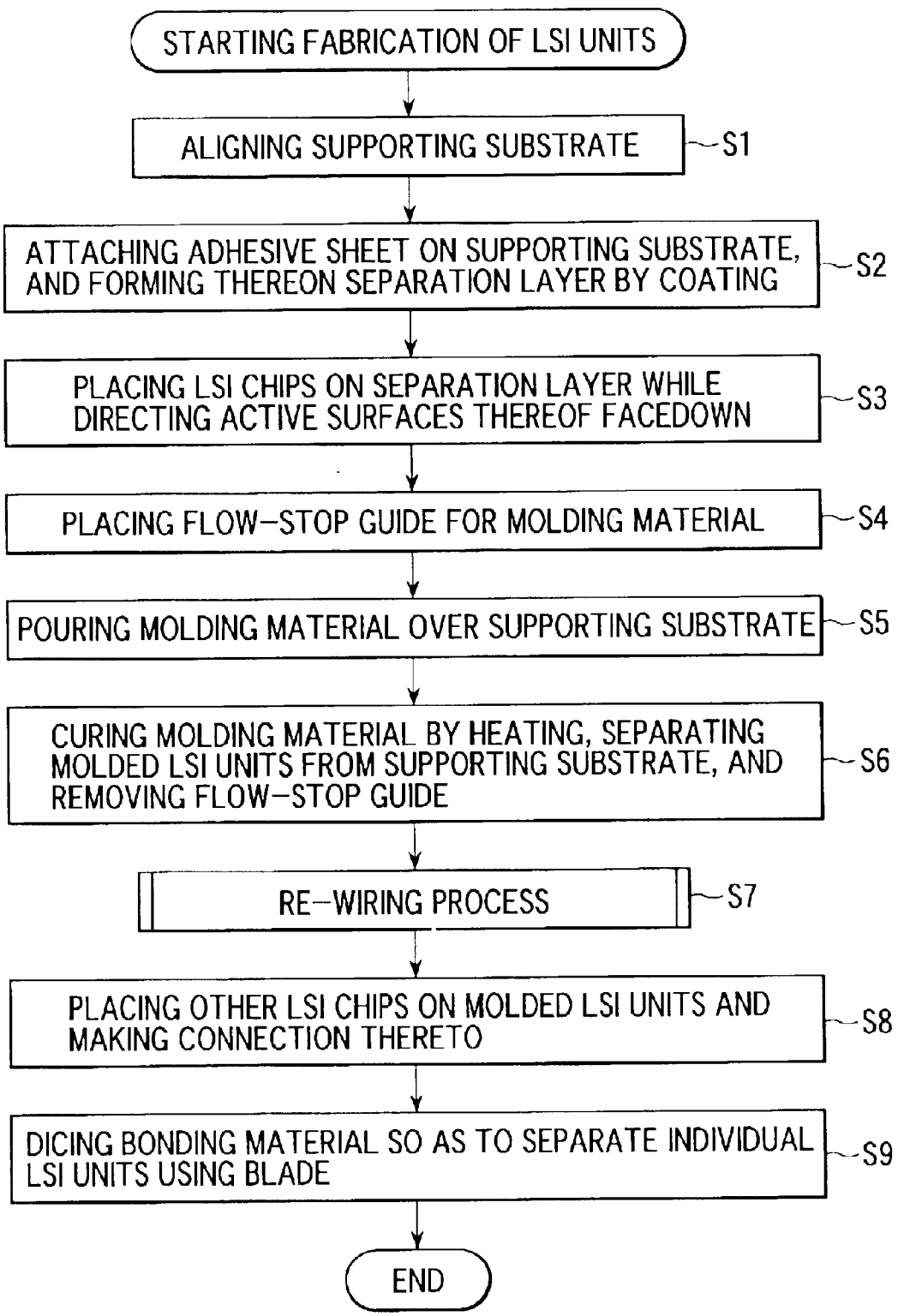
FIG. 4 is a flow chart for explaining operations of the fabrication process apparatus for LSI unit shown in FIG. 3.
Figure 5E:
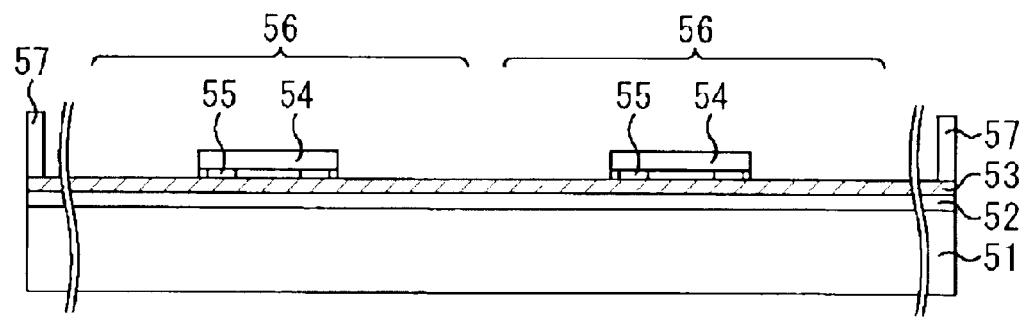
Figure 5F:
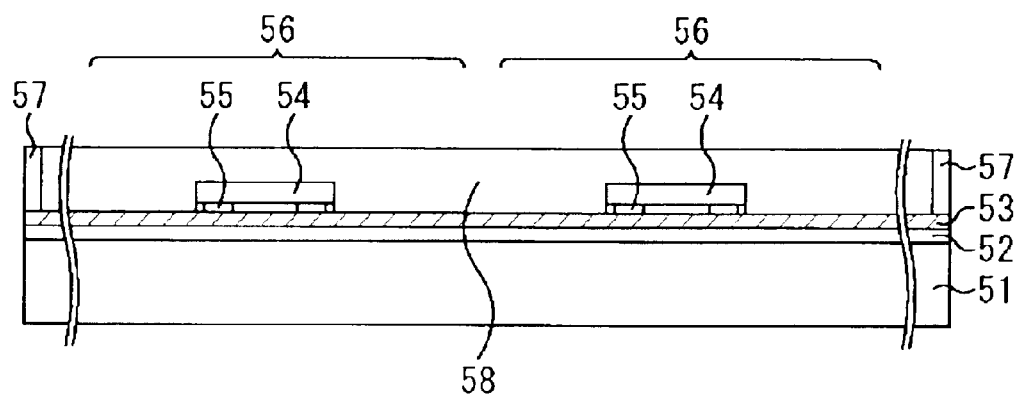

Next in step S4 shown in FIG. 4, the guide processing section 34 places, on the periphery of the supporting substrate 51 as shown in FIG. 5E, the flow-stop guide 57 for preventing outflow of the molding material 58 (FIG. 5F) which is used for molding the LSI units 56. Shape of the flow-stop guide 57 may be round or square so far as it can stop the flow. Thereafter in step S5, the molding material processing section 35 pours over the supporting substrate 51 the molding material 58 (FIG. 5F) for molding the LSI units 56.

The molding material 58 is made of a resin and a filler. The resin is used for a base of the molding material 58, and is made of such as an epoxy resin. It is, however, to be noted that the epoxy, resin generally has property of large curing shrinkage and thermal expansion coefficient causing to warping or crack, so that it is necessary to select those having relatively small relevant values. As an additional measure, a large amount of filler is mixed therewith so as to prevent warping or crack of the resin, to thereby reduce distortion of the molding material 58. Spherical silica (quartz) having a small heat expansion coefficient is typically used as the filler. The spherical silica can be contained in the molding material 58 in an amount of up to 90% of weight ratio by properly combining varied grain size thereof.

It is of course allowable to use other organic resins in place of epoxy resin, and to use other materials such as glass or ceramic in place of spherical silica.

Next in step S6 shown in FIG. 4, the heat treatment section 36 cures the molding material 58 with heat, and then separates the cured bonded material from the supporting substrate 51. The guide processing section 34 removes the flow-stop guide 57 (FIG. 6G). More specifically, everything formed on the supporting substrate 51 is heated at 100° C. for 30 minutes, and further at 150° C. for 80 minutes. Since the separation layer 53 lowers the adhesive force of the adhesive sheet 52 by this heating, the molding material 58 and the active surfaces of the LSI units 56 can readily be separated from the supporting substrate 51, which produces a molded semiconductor LSI integrated board.

Next in step S7, the re-wiring section 37 executes re-wiring operation of the semiconductor LSI integrated board (LSI units 56). The re-wiring operation of the LSI units 56 will be explained referring to the flow chart shown in FIG. 6.

Figure 5G:
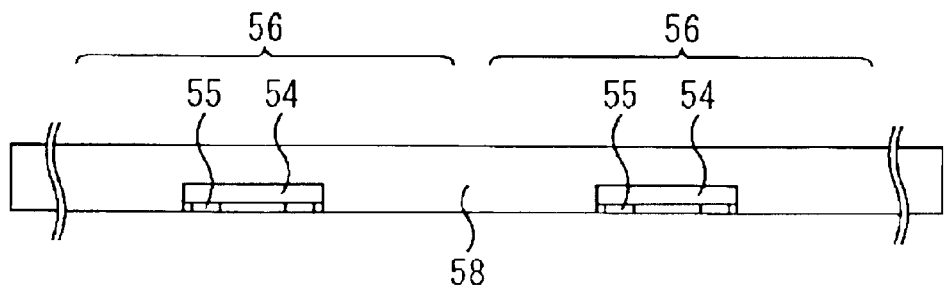
Figure 5H:
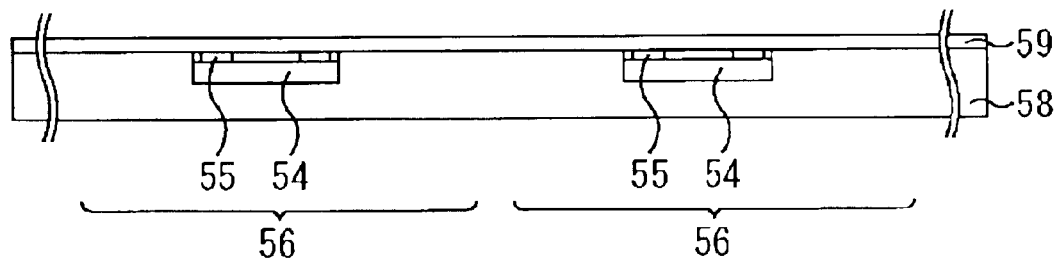

FIG. 5H shows the LSI units 56 shown in FIG. 5G which turned up the active surfaces. The bonding pads 55 of the LSI chips 54 are thus positioned in the upper planes of the LSI units 56.

Now in step S21, as shown in FIG. 5H, the re-wiring processing section 37 coats, using a spinner, an overcoat resin (e.g., photo-sensitive polyimide liquid resin) over the active surfaces of the LSI units 56 so as to form an inter-layer film 59. The inter-layer film 59 planarizes the cured molding material 58 and the active surfaces of the LSI units 56, and also serves as a passivation film for the LSI chips 54.

Figure 5I:
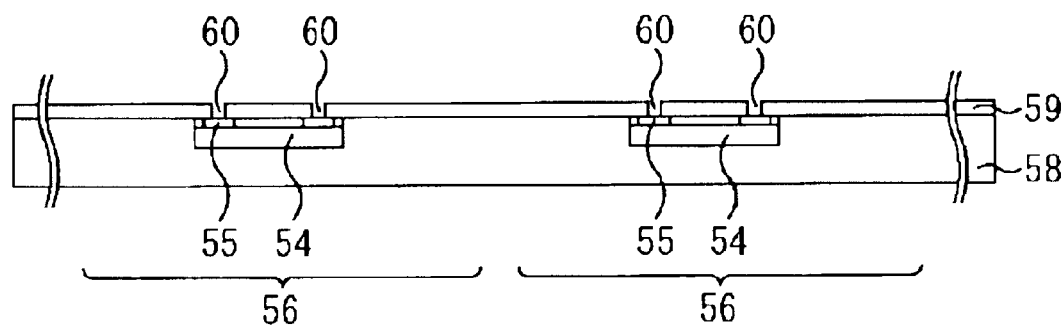

The re-wiring processing section 37 further forms contact holes 60 having a diameter of 30 μm or below in the inter-layer film 59 at predetermined positions (positions corresponded to the bonding pads 55 of the LSI chips 54) as shown in FIG. 5I. Actually in the bond area for the LSI chip 54, several hundreds to several thousands of contact holes 60 for the re-wiring of the LSI chip 54 are formed per LSI unit 56. The contact holes 60 are made by forming a photoresist film on the inter-layer film 59, exposing and developing predetermined positions of the photoresist film, and the resultant portion of the photoresist film is then cured by heating and used as a mask for etching the inter-layer film 59.

Figure 5J:
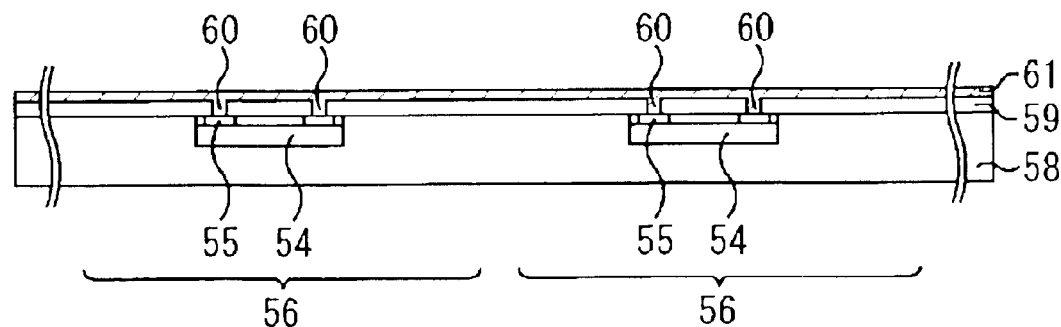

Next in step S23, the re-wiring processing section 37 forms, as shown in FIG. 5J, a metal thin film 61 which will later serve as a re-wiring layer 62 (FIG. 5K) on the inter-layer film 59 having formed therein the contact holes 60. Part of the metal thin film 61 is connected to the bonding pads 55 through the contact holes 60. The metal thin film 61 comprises an underlying layer of nickel or chromium and a copper layer stacked thereon, both of which are formed by sputtering. The underlying layer improves adhesiveness of the inter-layer film 59 with the copper film, and has a thickness of 50 to 200 nm. The copper layer has a thickness of 500 nm to 5 μm.

Figure 5K:
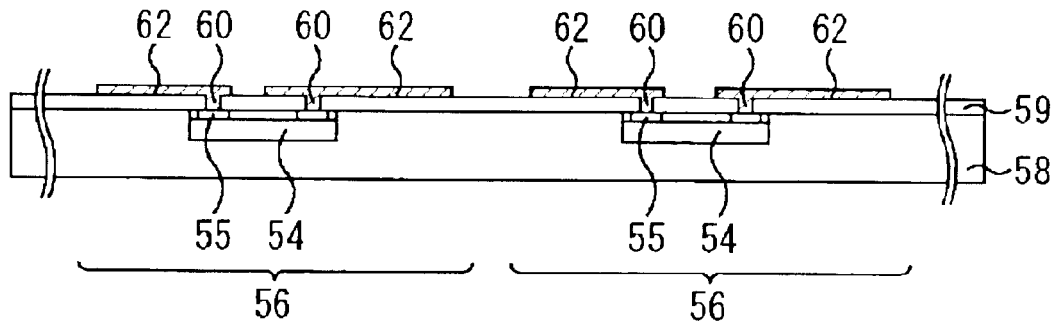

Next in step S24, the re-wiring processing section 37 forms on the metal thin film 61 a mask pattern including a master pattern for a predetermined circuit using a photoresist by a photolithographic process. Then instep S25, the re-wiring processing section 37 etches the metal thin film 61 having formed thereon the photoresist mask pattern having a master pattern for a predetermined circuit using a specialized etching solution for the metal, to thereby transfer the circuit pattern to the metal thin film 61. The re-wiring processing section 37 then removes the resist mask from the metal thin film 61. The re-wiring layer 62 is thus formed on the inter-layer film 59 as shown in FIG. 5K.

Figure 5L:
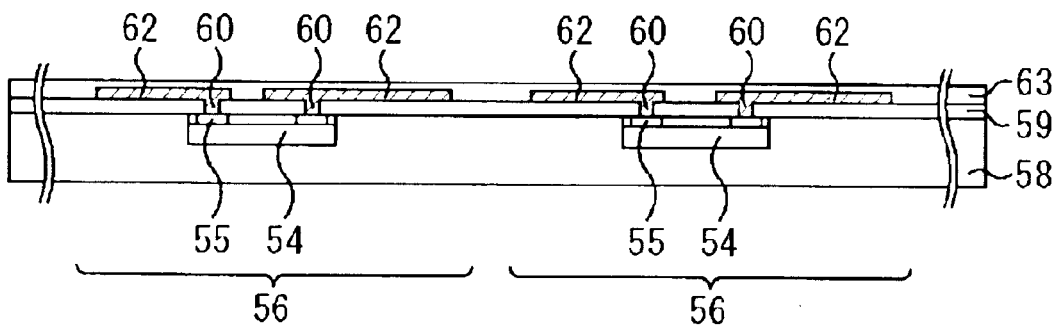
Figure 5M:
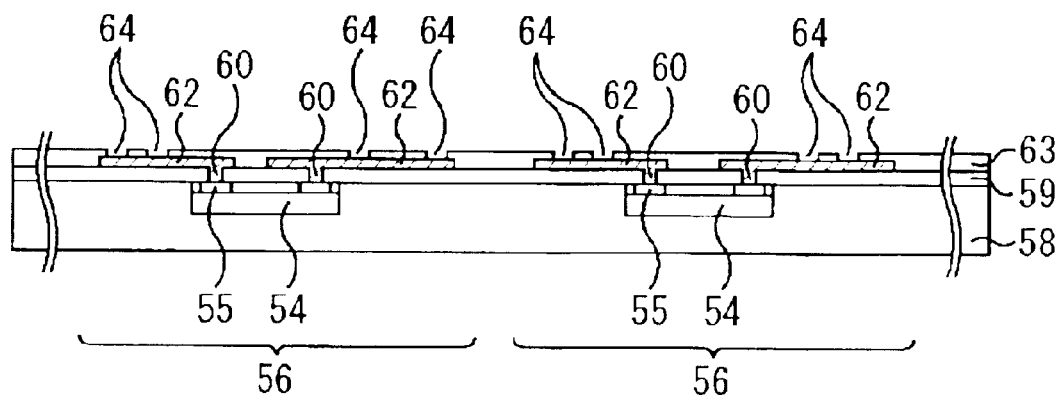

Next in step S26, the re-wiring processing section 37 forms, as shown in FIG. 5L, a resin layer 63 using, for example, an epoxy resin on the LSI units 56 having formed thereon the re-wiring layer 62, and further, in step S27, forms bonding pads 64 (FIG. 5M) as being exposed in the resin layer 63 corresponding to the position of bonding pads 66 of the LSI chips 65 placed in the later process shown in FIG. 5N. The bonding pads 64 are formed as a portion of the re-wiring layer 62 exposed in the resin layer 63, where the resin layer 63 is patterned by forming thereon a photoresist film, exposing and developing predetermined positions of the photoresist film, and the resultant portion of the photoresist film is then cured by heating and used as a mask for etching the resin layer 63.

Upon completion of the re-wiring processing as described in the above, the electronic device bonding section 38 aligns, in step S8 shown in FIG. 4, the LSI chips 65 on the LSI units 56 having formed thereon the bonding pads 64 while directing the active surfaces of the LSI chips 65 facedown so as to electrically connect them through the bonding pads 64. More specifically, bumps 67 are formed on the individual bonding pads 64, and the provided LSI chips 65 are placed on the LSI units 56 using a mounter having an image recognition function at the positions previously defined in a precise manner with an accuracy of ±5 μm or higher while directing the active surfaces thereof facedown (so that the active surfaces of the LSI chips 54 in the LSI units 56 and active surfaces of the LSI chips 65 are opposed). This makes the bonding pads 66 of the LSI chips 65 electrically connected to the bonding pads 55 of the LSI chips 54 while being mediated by the bumps 67 and the bonding pads 64 (re-wiring layer 62).

The LSI chips 65 are such as those fabricated in the single process similarly to the LSI chips 54, and has already been inspected as non-defective. It is also allowable to place passive components such as capacitor or resistor in place of the LSI chips 65.

Figure 5N:
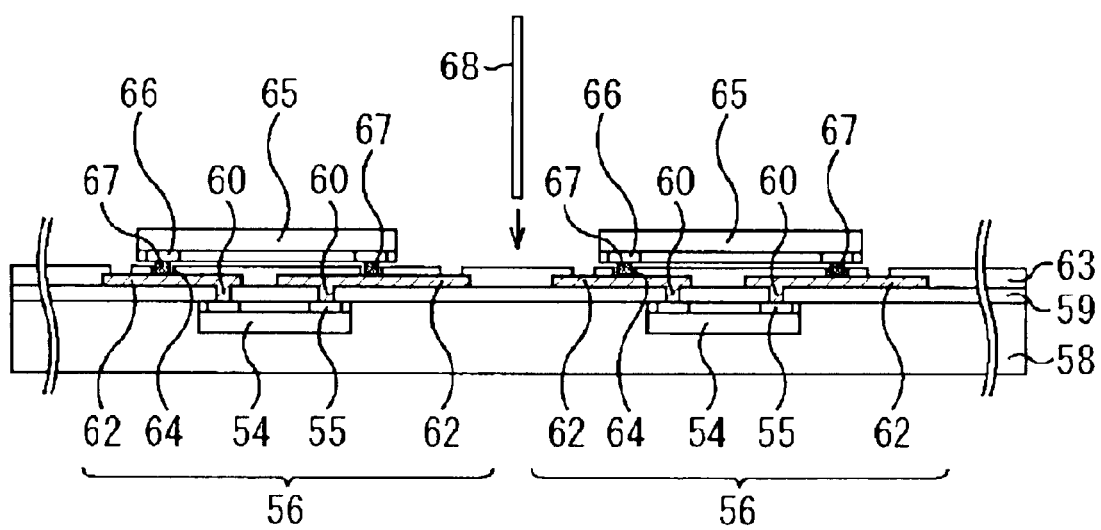

While FIGS. 5A through 5N showed only two LSI units 56, the actual semiconductor LSI integrated board have a larger number of the LSI units 56. Then in step S9 shown in FIG. 4, the dicing section 39 dices (cuts) thus-produced semiconductor LSI integrated board using a blade 68 so as to separate the individual units as shown in FIG. 5N. A number of LSI units 56 are thus obtained.

As has been described in the above, in the LSI unit 56 applied to the present embodiment, the bonding pads 64 can be formed at arbitrary positions so as to correspond to the position of electronic devices (e.g., bonding pads 66 of the LSI chips 65). This relieves the positional restriction of the bonding pads of the electronic devices and thus allows a great variety of electronic devices to be used, so that it is no more necessary in the fabrication of the LSI units 56 to re-design the electronic devices to be connected thereto, which is also advantageous for reducing the cost.

Figure 7:
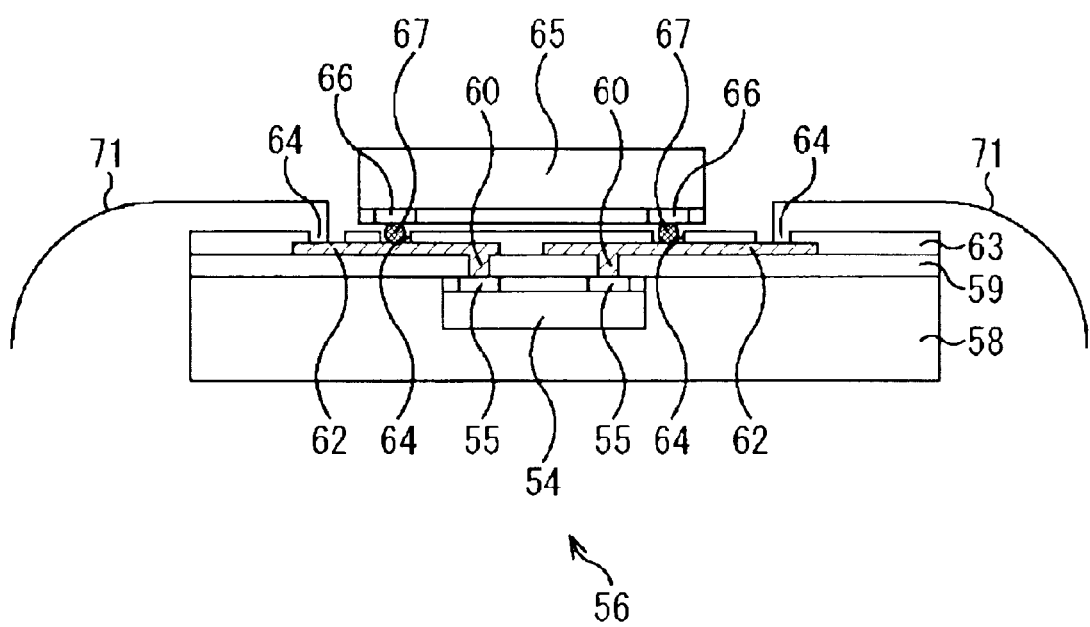
FIG. 7 is a sectional side elevation showing an exemplary configuration of the LSI unit of another embodiment of the present invention.

FIG. 7 shows an exemplary configuration of the LSI unit 56 obtained after dicing the semiconductor LSI integrated board shown in FIG. 5N. It is to be noted that, in FIG. 7, since portions corresponded to those shown in FIGS. 5A through 5N are given with the same reference numerals, detailed description of them are omitted in order to avoid redundancy.

The LSI unit 56 comprises the LSI chip 54 having bonding pads 55, and another LSI chip 65 having the bonding pads 66. The LSI unit 56 is also connected to an external circuit with wirings 71 through the bonding pads 64 shown on the leftmost and rightmost sides of the drawing.

Since the LSI unit 56 is fabricated in such a way that the LSI chip 54 is molded in the molding material 58, re-wired, and formed the bonding pads 64 as being corresponded to (the bonding pads 66 of) the position of the LSI chip 65, so that the bonding pads 64 are formed over the molding material 58. This makes it possible that the LSI chip 65 having a larger size than that of the LSI chip 54 is stacked and connected to the LSI chip 54, and that the LSI chip 65 even having the bonding pads 66, of which layout is different from that of the bonding pads 55 of the LSI chip 54, is stacked and connected to the LSI chip 54.

While the molded LSI chip 54 and the external LSI chip 65 are electrically connected through the bumps 67 in the above-described LSI unit 56, the connection may be established through an anisotropic conductive adhesive, or through wire bonding using another set of bonding pads tailored to the LSI chip 65 when re-wiring the molded LSI chip 54.

Figure 8:
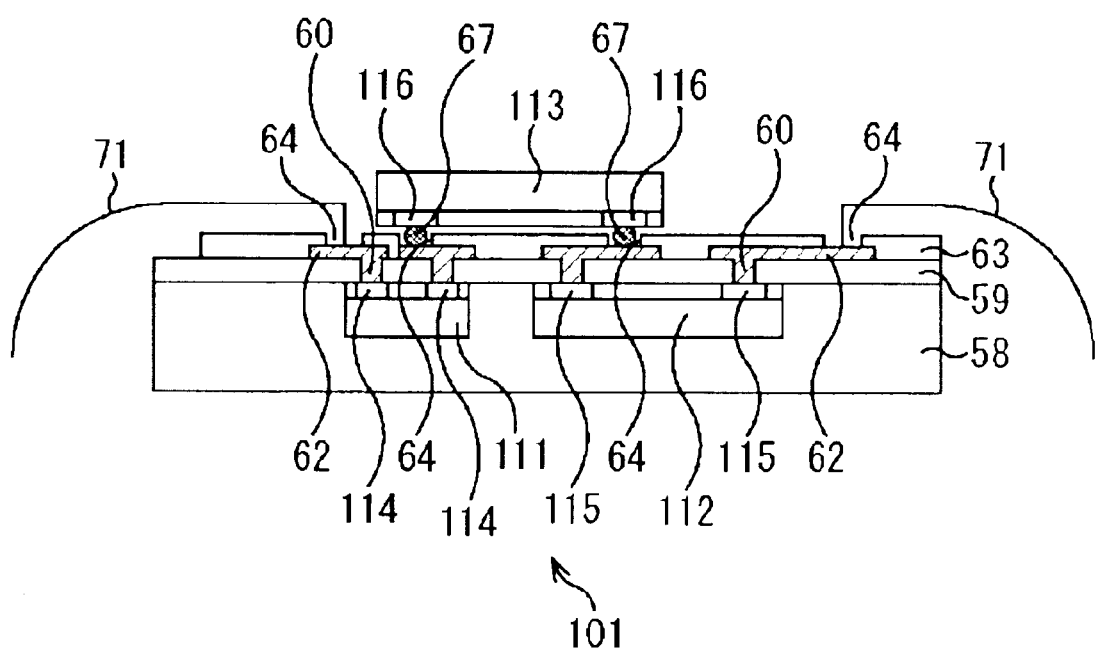
FIG. 8 is a sectional side elevation showing an exemplary configuration of the LSI unit of still another embodiment of the present invention.

FIG. 8 shows another exemplary configuration of the LSI unit applied to the present invention. It is to be noted that, in FIG. 8, since portions corresponded to those shown in FIG. 7 are given with the same reference numerals, detailed description of them are omitted in order to avoid redundancy.

An LSI unit 101 comprises an LSI chip 111, an LSI chip 112 and an LSI chip 113, all of which are fabricated by the single process similarly to the LSI chip 54, and are inspected as non-defective.

In the LSI unit 101, the LSI chip 111 having bonding pads 114 and the LSI chip 112 having bonding pads 115 are molded in the molding material 58, and thereon the LSI chip 113 having bonding pads 116 is placed so as to make the individual active surfaces opposed each other, and is electrically connected through the bumps 67.

In this case, since the LSI chip 111 and LSI chip 112 are molded in the molding material 58, re-wired, and provided with the bonding pads 64 as being corresponded to the bonding pads 116 of the LSI chip 113, the bonding pads 64 are formed over the molding material 58. This is advantageous for the case where a plurality of different types of LSI chips are molded in the molding material, since it is no more necessary to re-design the LSI chip to be connected as being tailored to the molded LSI chips. The LSI unit 101 can thus be formed using the ready-made LSI chip 113.

Figure 9:
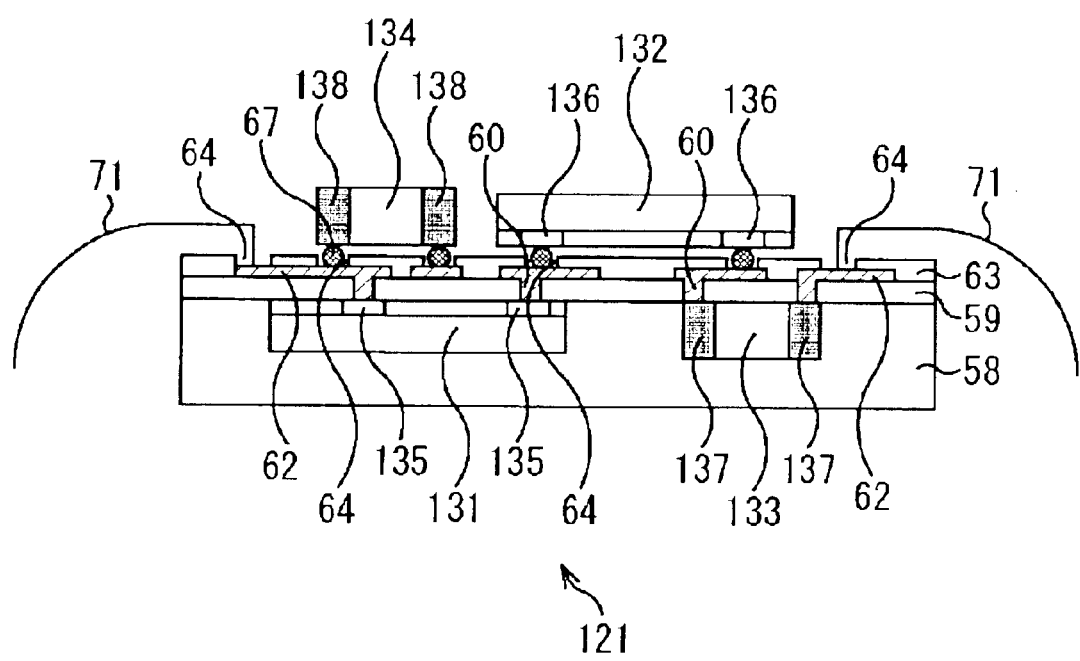
FIG. 9 is a sectional side elevation showing an exemplary configuration of the LSI unit of still another embodiment of the present invention.

FIG. 9 shows still another exemplary configuration of the LSI unit applied to the present invention. It is to be noted that, in FIG. 9, since portions corresponded to those shown in FIG. 7 are given with the same reference numerals, detailed description of them are omitted in order to avoid redundancy.

An LSI unit 121 comprises an LSI chip 131 and an LSI chip 132, both of which are fabricated by the single process similarly to the LSI chip 54 and are inspected as non-defective, and passive components 133 and 134 such as capacitor or resistor.

In the LSI unit 121, the LSI chip 131 having bonding pads 135 and the passive component 133 having the bonding pads 137 are molded in the molding material 58, and thereon the passive component 134 having bonding pads 138 and the LSI chip 132 having bonding pads 136 are placed so as to make the individual active surfaces opposed with each other, and are electrically connected through the bumps 67.

As shown in the above, use of passive components in place of LSI chip can also provide the LSI unit 121 applied to the present invention.

Figure 10:
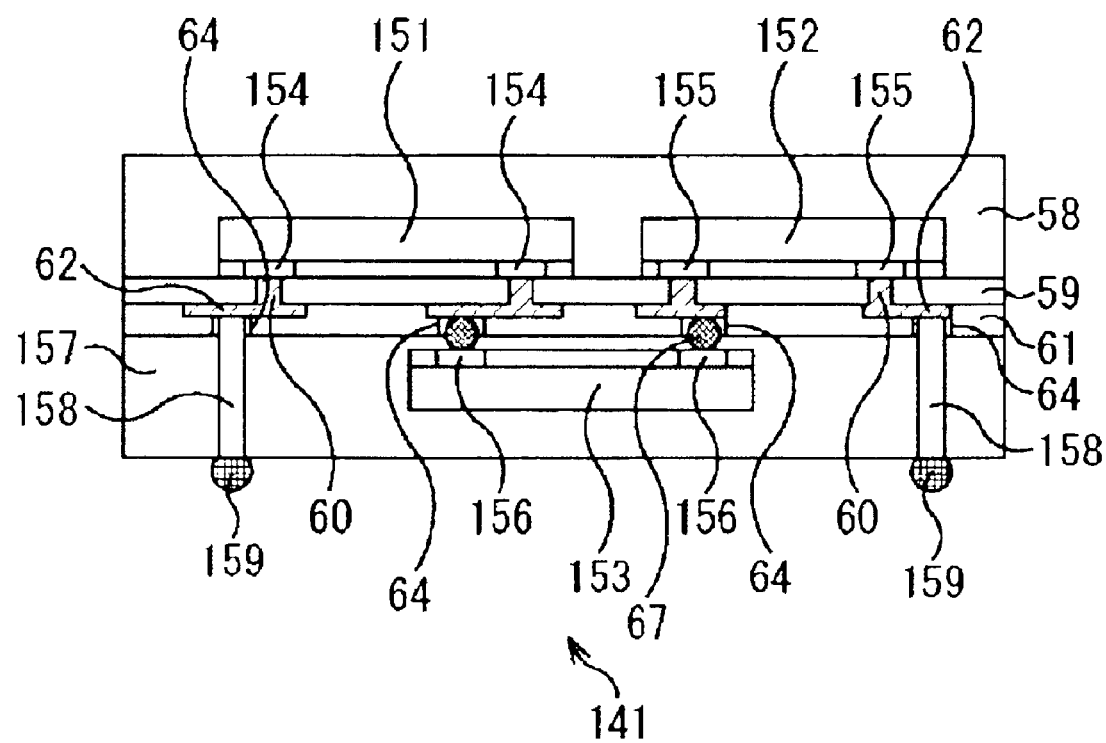
FIG. 10 is a sectional side elevation showing an exemplary configuration of the LSI unit of still another embodiment of the present invention.

FIG. 10 shows still another exemplary configuration of the LSI unit applied to the present invention. It is to be noted that, in FIG. 10, since portions corresponded to those shown in FIG. 7 are given with the same reference numerals, detailed description of them are omitted in order to avoid redundancy.

An LSI unit 141 comprises an LSI chip 151, an LSI chip 152 and an LSI chip 153, all of which are fabricated by the single process similarly to the LSI chip 54 and are inspected as non-defective.

In the LSI unit 141, the LSI chip 151 having bonding pads 154 and the LSI chip 152 having bonding pads 155 are molded in the molding material 58, and thereunder the LSI chip 153 having bonding pads 156 is placed so as to make the individual active surfaces opposed with each other, and is electrically connected through the bumps 67. The LSI chip 153 is molded in a molding material 157 together with copper posts 158 which are connected to the bonding pads 64 shown on the leftmost and rightmost sides in the drawing. The LSI unit 141 is connected to an external circuit (not shown) through the copper posts 158 and the bumps 159.

The present invention can successfully be applied also to thus-composed LSI unit 141.

As is clear from the above description, the present invention can readily provide chip-on-chip LSI units based on combination of ready-made LSI chips since restrictions on the size of LSI chips and layout of bonding pads can be relieved. This allows expansion of scale of LSI units without enlarging the mounting area.

Mixed use of the passive components in place of the LSI chips in the LSI unit can further ensure improved performance and expanded scale of the LSI unit.

Further, since such LSI unit can be handled as a single chip, investing in the assembly facility is no more necessary and thus the production costs can be saved.

Therefore, according to the present invention, the system scale can be expanding at a low cost.

Finally, the embodiments and examples described above are only examples of the present invention. It should be noted that the present invention is not restricted only to such embodiments and examples, and various modifications, combinations and sub-combinations in accordance with its design or the like may be made without departing from the scope of the present invention.

What is claimed is:

1. An electronic component obtained by providing a molded structure around sides of one or more first electronic devices, and interfacing one or more second electronic devices to said first electronic devices, said component further comprising:
    a metal re-wiring layer formed between said first electronic devices and said second electronic devices, said re-wiring layer patterned so as to form a predetermined circuit,
    and wherein said re-wiring layer provides a plurality of individual connections between pads of said first electronic devices and corresponding pads of said second electronic devices.

2. The electronic component as claimed in claim 1, wherein said electronic devices are semiconductor chips.

3. The electronic component as claimed in claim 1, wherein said first electronic devices interface with said re-wiring layer through bonding pads formed over said molding material.

4. The electronic component as claimed in claim 1, wherein said re-wiring layer connects an external circuit to one of the electronic devices contained within the component.

5. The electronic component as claimed in claim 1, wherein the active surfaces of said first electronic devices oppose the active surfaces of said second electronic devices.

* * * * *